United States Patent [19]

Naumann et al.

[11] Patent Number: 4,738,831
[45] Date of Patent: Apr. 19, 1988

[54] METHOD AND APPARATUS FOR GROWING CRYSTALS

[75] Inventors: Robert J. Naumann; Sandor L. Lehoczky; Donald O. Frazier, all of Huntsville, Ala.

[73] Assignee: The United States of America as represented by the Administrator of the National Aeronautics & Space Administration, Washington, D.C.

[21] Appl. No.: 925,189

[22] Filed: Oct. 31, 1986

[51] Int. Cl.⁴ .............................................. B01D 9/00
[52] U.S. Cl. .................... 422/246; 156/607; 156/621; 156/624; 156/DIG. 70; 156/DIG. 72; 156/DIG. 82; 156/DIG. 84; 156/DIG. 89; 156/DIG. 92; 156/DIG. 93; 156/DIG. 98; 156/616.2; 156/616.3; 156/616.4; 422/248; 164/122.2

[58] Field of Search ............... 156/617 R, 617 H, 607, 156/616 A, 620, DIG. 70, DIG. 72, DIG. 82, DIG. 84, DIG. 89, DIG. 92, DIG. 93, DIG. 98, DIG. 62, 8 PL, DIG. 22, 619, 621, 624; 422/246, 248; 164/122.1, 122.2

[56] References Cited

U.S. PATENT DOCUMENTS 3,088,853  5/1963  Harper .............................. 156/619
4,185,076  1/1980  Hatch et al. ....................... 422/246
4,585,511  4/1986  Bult et al. ........................... 156/607
4,645,560  2/1987  Matsumoto et al. ............... 156/607

FOREIGN PATENT DOCUMENTS 1201688  3/1985  Japan ................................ 156/624

OTHER PUBLICATIONS

IBM Technical Disclosure Bulletin, vol. 22, (5), Oct. 1979, pp. 2096–2097.

Primary Examiner—Asok Pal
Attorney, Agent, or Firm—Joseph H. Beumer

[57] ABSTRACT

A crystal growth apparatus (10) having a heated spherical growth container (12) is filled with a crystalline material in solid or liquid form. The crystalline material is heated by resistance heating wire (58) to a predetermined temperature, whereupon the application of heat to the crystalline material is reduced and the accumulated heat is drawn off and dissipated by a seed crystal (76) attached to a rod (70) of heat conductive material, which in turn is attached to a heat dissipating member (72). This results in the formation of a single, defect-free crystal on seed crystal (76), which grows outward in a generally spherical configuration as more heat is removed.

7 Claims, 5 Drawing Sheets

METHOD AND APPARATUS FOR GROWING CRYSTALS

ORIGIN OF THE INVENTION

The invention described herein was made by employees of the U.S. Government and may be manufactured and used by or for the Government for Government purposes without the payment of any royalties thereon or therefor.

TECHNICAL FIELD

This invention relates generally to methods and apparatus employed in growing crystalline structures, and more particularly to a method and apparatus for the bulk growth of defect-free compound crystals.

BACKGROUND OF THE INVENTION

With the discovery of semiconductor materials and subsequent development of integrated circuitry there arose the need to grow large or defect-free crystals of elemental materials such as silicon (Si) and more recently compound materials such as gallium arsenide (GaAs). Crystalline structures are widely used in the manufacture of electrical circuitry, optical systems and other microminiature devices. Several techniques have been utilized for growing crystals, but none of them are believed capable of growing larger crystals of the compound systems now needed while maintaining low defect densities. A brief review of existing methods are hereinafter set forth.

The Czochralski method is one wherein a seed crystal is dipped into a container of molten material from which a crystal is to be grown, and the growing material is pulled vertically from the molten material. A difficulty with this method is that when applied to gallium arsenide (GaAs), the crystals typically have large defect densities on the order of $10^3$–$10^4$/cm$^3$. This limits its used in large scale integration circuitry despite the general advantages of gallium arsenide over silicon. Similarly, cadmium telluride (CdTe), which is used as a substrate in focal plane arrays, is subject to defects, such as dislocations, low angle grain boundaries, and twin crystal formation when the substrate crystal is grown by conventional techniques. Current methods used in the crystal growth process include several types of molten zone growth methods.

The Bridgman-Stockbarger method utilizes an elongated container of semiconductor material which is melted in a high temperature furnace, after which the container is lowered into a cooler, lower temperature furnace, which allows the material to slowly resolidify as a single crystal. The molten material from which the crystal is grown is completely enclosed during the process, and as a result, strains occur in the material which induce defects when the molten material solidifies.

In a method referred to as the horizontal Bridgman method, an open boat-type container is used to hold molten crystal material which is then slowly cooled to allow a crystal to form in the boat. This approach attempts to solve the problems referred to with respect to the Bridgman-Stockbarger method by holding the material in the open-boat container, allowing free expansion of the forming crystal when it solidifies. Convective flows are uncontrolled, however, resulting in impurities being transported from the walls of the container, causing undesirable doping of the grown crystal. Further, crystals grown by this method are D-shaped, which is undesirable for integrated circuit construction.

Finally, there is the float zone technique. It eliminates the container of the Bridgman-Stockbarger approach and uses a polycrystalline rod supported at each end which is passed through a region of high intensity heat. Float zone crystal growth does offer good possibilities for reducing growth defects since container walls are eliminated and since heat is added horizontally around the circumference. This creates radial thermal gradients in the melt which may be arranged to provide a convex growth interface. In fact, it has been possible to grow dislocation-free silicon (Si) by this process. There are, however, several limitations in extending float zone growth to other materials: (1) Si has an unusually large surface tension (10 times that of $H_2O$) which helps support large molten zones; (2) molten Si is a good electrical conductor which allows RF induction heating, which also provides additional Lorentz forces to help support the molten zone; and (3) even though it is possible to eliminate dislocations in float zone Si, there are severe growth rate fluctuations and thus compositional striations caused by the heating asymmetry inherent in the RF work coil and by uncontrolled convection driven by buoyant as well as surface tension forces. In fact, a recent space experiment indicated that surface tension-driven convection may be the dominant cause of such striations. The growth rate fluctuations are not particularly serious in an intrinsic elemental semiconductor such as Si but could produce serious inhomogeneities and defects in extrinsic, alloy type, or compound semiconductors. Another difficulty with conventional float zone growth of multicomponent systems is the control of stoichiometry since the more volatile component will tend to evaporate at the free surface. Liquid phase encapsulants cannot generally be used because of gravity drainage. Maintaining an over pressure of the volatile component may not be possible because of the temperature variations associated with the process since the maximum pressure of a particular component that can be obtained is the vapor pressure of the component in question at the temperature of the coldest region in the pressure vessel. Finally, the float zone process cannot be successfully applied to many materials on earth because of their low surface tension. This is especially true for poor conductors because Lorentz forces cannot be used to help support the molten zone.

It is the object of this invention to provide an improved apparatus for growing relatively large, defect-free crystals of compound materials.

Another object is to provide a method of growing such crystals.

SUMMARY OF THE INVENTION

In accordance with this invention, crystal growth is carred out in an apparatus having an enclosure with a spherical interior which is provided with an adjustable heat source. A seed crystal is positioned within this interior and is connected to one end of a rod of heat conductive material which extends through the enclosure. The rod is independently heated, and a heat absorber is connected to an opposite end of the rod. Crystalline material is placed in the interior of the sphere and in engagement with the seed crystal, and pressure is applied to it. A crystal structure is grown by heating the crystalline material up to a predetermined temperature while controlling heat dissipation through the rod by the application of heat to the rod. After the predetermined temperature is achieved in the crystalline material, heat application is reduced, allowing heat to escape via the seed crystal and the rod of material. This cools the heated crystalline material around the seed crystal, and causes crystalline material to be deposited as a single crystal on the seed crystal. As more heat is removed from the heated crystalline material, more material is deposited, growing outward from the seed crystal in a generally spherical configuration.

DETAILED DESCRIPTION OF THE DRAWINGS

Figure 1:
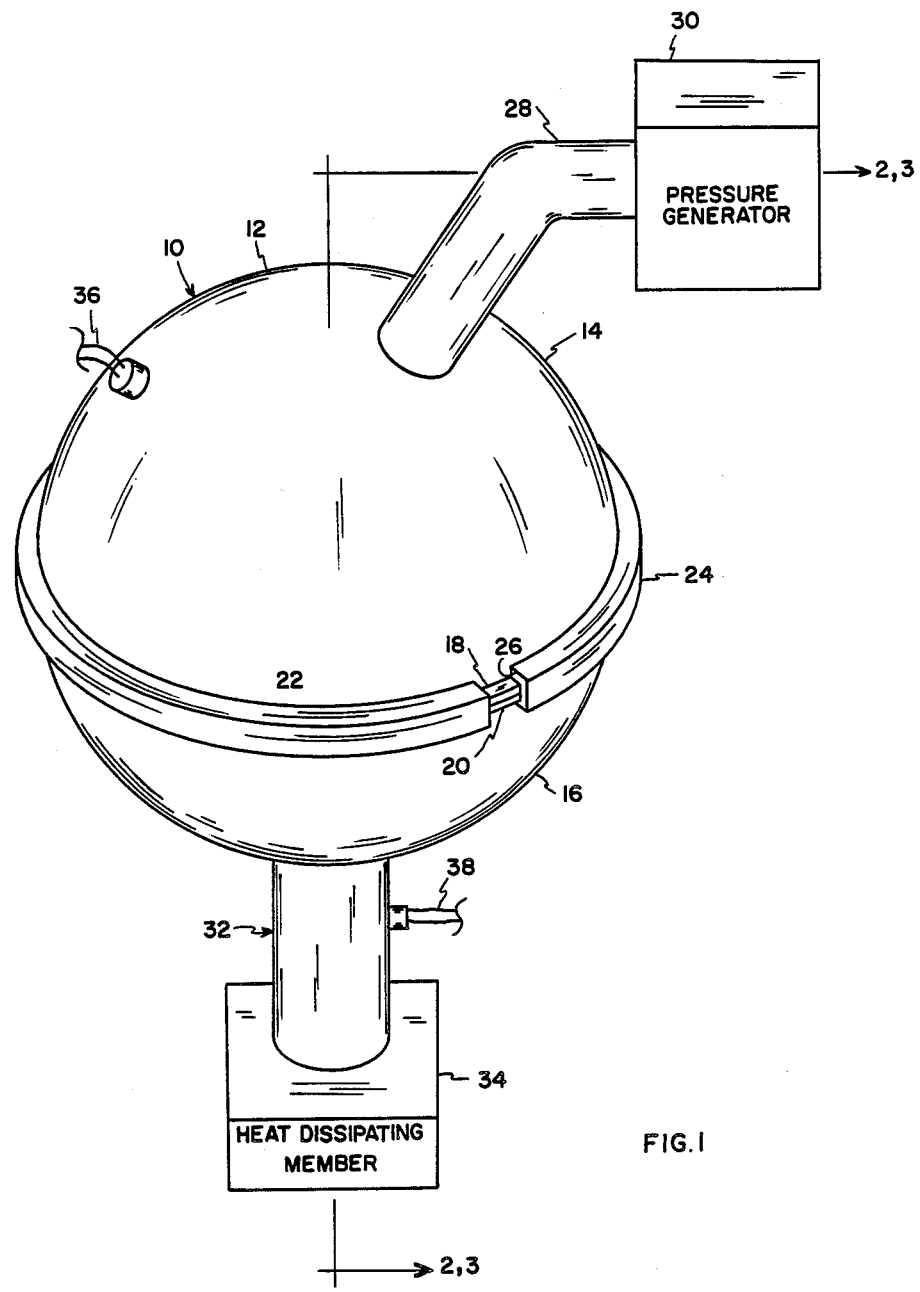
FIG. 1 is a pictorial view illustrating a crystal growth apparatus.

Referring initially in FIG. 1, an apparatus 10 is generally illustrated for growing crystals. A spherical crystal growth container 12 is configured having an upper hemisphere 14 and a lower hemisphere 16. Hemispheres 14 and 16 are provided with sealably engaging flanges 18 and 20, respectively, which encircle container 12 around a central region 22. A clamping ring 24 clamps flanges 18 and 20 together and has an open region 26 which allows ring 24 to be expanded and removed, further allowing hemispheres 14 and 16 to be separated. Attached to upper hemisphere 14 is a tubular member 28, which in turn is connected to a pressure generator 30. Connected to lower hemisphere 16 is a second tubular member 32, it being attached to a heat dissipating member 34. Electrical power is provided by a power source (not shown) and is connected to apparatus 10 by a set 36 of wires to upper hemisphere 14 and a second independent set 38 of wires connected to tubular member 32.

Figure 2:
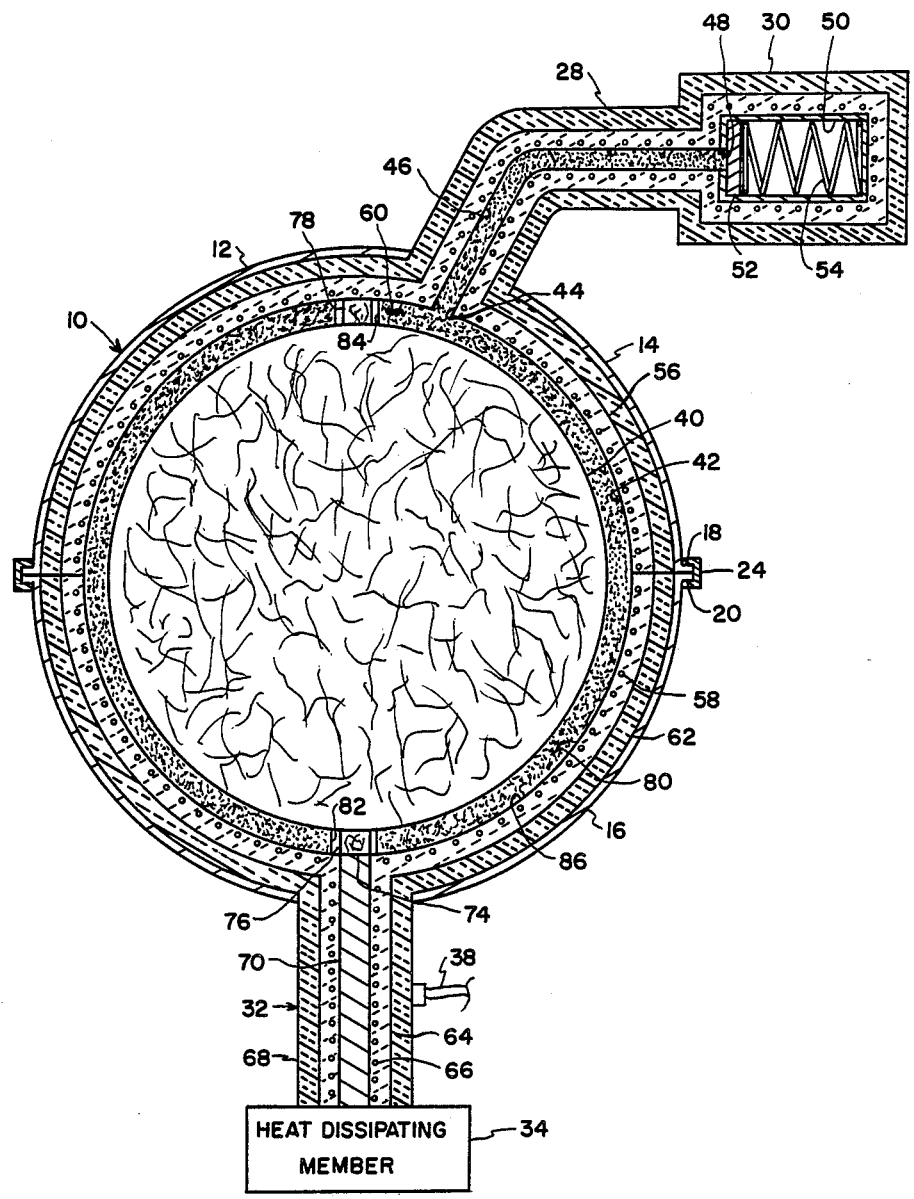
FIG. 2 is a sectional elevational view taken along line 2—2 of FIG. 1.

Referring now to FIG. 2, a sphere 40 of crystalline material to be processed and certain interior details of apparatus 10 are illustrated. As shown, interior 42 of container 12 is also spherically configured, with an opening 44 in upper hemisphere 14 which communicates with a tubular channel 46 in member 28. Channel 46 in turn is connected to an opening 48 in pressure generator 30. Generator 30 consists of a cylinder 50 containing a piston 52 which is biased by a spring 54 toward opening 48 leading to channel 46. Interior wall 56 of container 12 is constructed of a refractory material having a high thermal conductivity, with this material extending into and coating the interior of channel 46 and generator 30. Embedded in wall 56 is a strand of electrically resistive heating wire 58 which is connected to set 36 of wires and is spherically wrapped around container 12, member 28, and generator 30. Wire 58 provides heat to interior 42 of container 12 while additionally providing heat to member 28 and generator 30, preventing any undesirable cooling in interior region 60 around opening 44. A layer of insulation 62 around container 12, member 28, and generator 30 confines heat within these components.

Tubular member 32 is attached to lower hemisphere 16 and is constructed with a refractory wall 64 within which a second strand of resistive heating wire 66 is embedded. A layer of insulation 68 surrounds member 32 and confines heat within tubular member 32. The heat is applied to heat conductive rod 70 which is constructed of a material selected to provide minimum contamination of sphere 40 during processing. Rod 70 serves to transfer heat from interior 42 of container 12 to heat dissipating member 34. Attached to end 74 of heat conductive rod 70 is a seed crystal 76 which is cooled by rod 70 and assists in supporting crystalline sphere 40. A second support 78, attached to upper hemisphere 12 in combination with seed crystal 76, provides a stable configuration for sphere 40 when it is in the molten state.

Sphere 40 of crystalline material is conventionally constructed having a uniform spherical shape. It is then coated by an encapsulant material 80 with openings 82 and 84 formed in encapsulant 80 to accommodate seed crystal 76 and upper support 78. The material of encapsulant 80 is selected for chemical and electrical properties compatible with the material of sphere 40 and also for properties which are desirable for crystal growth. For example, encapsulant 80 must not provide any doping or contamination to sphere 40 when both are in a molten state. Further, encapsulant 80 must be very viscous when molten to provide damping of surface tension driven convective flows in sphere 40. Additionally, encapsulant 80 must be immiscible with sphere 40 when both are molten and have wetting properties which wet interior wall 86 of container 12 in preference to sphere 40. Such encapsulants with these properties are known to exist for some semiconductor materials; for example, boron oxide ($B_2O_3$) is used as an encapsulant for gallium arsenide (GaAs) and calcium fluoride ($CaF_2$) can be used in silicon (Si) and germanium (Ge) systems.

After sphere 40 is coated as described, it is placed in lower hemisphere 16, with opening 82 in encapsulant 80 fitting over seed crystal 76. Channel 46 in member 28 is filled with encapsulant material, and upper hemisphere 14 is positioned over sphere 40 with upper support 78 fitting into opening 84 of encapsulant 80. Clamping ring 24 is then clamped over flanges 18 and 20 which sealably clamps apparatus 10 together and completes the assembly of apparatus 10.

Figure 3:
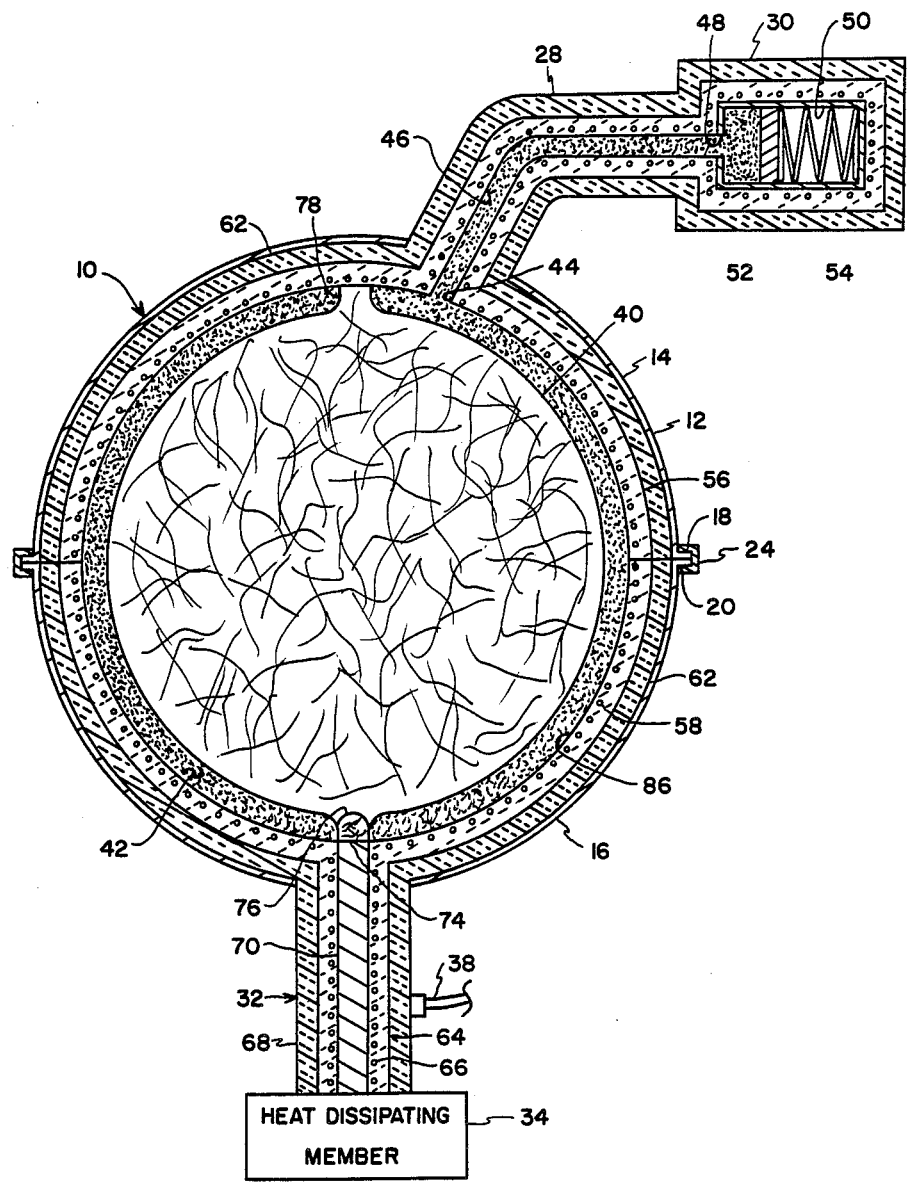
FIG. 3 is a sectional elevational view taken along line 3—3 of FIG. 1 and particularly illustrates details of operation of the crystal growth apparatus.

Referring to FIG. 3, the operation of apparatus 10 is illustrated. Power is initially applied to both sets 36 and 38 of wires, respectively. This energizes heating wires 58 and 66, the first of which provides heat to interior 42 containing sphere 40 and encapsulant 80 and the second providing heat to thermally conductive rod 70, preventing it from transferring heat from interior 42 to dissipating member 34. Initially, the power level of wire 58 is selected to first melt encapsulant 80, which permits piston 52 of generator 30 to distribute pressure to encapsulant 80. This pressure, which is provided by spring 54, is typically in the range of 10 to 100 PSI and is selected to be higher than the vapor pressure of the most volatile component of the material of sphere 40, which prevents losses of volatile components by evaporation and the formation of bubbles. After encapsulant 80 melts, continued application of power to wire 58 causes sphere 40 to melt, while seed crystal 76 is prevented from melting by lowering the applied power to wire 66. This cools seed crystal 76 by allowing transfer rod 70 to transfer heat from seed crystal 76 to heat dissipating member 34.

Any expansion or contraction of encapsulant 80 or sphere 40 is accommodated by a small amount of encapsulant flowing into or out of generator 30, which acts upon piston 52, which in turn acts against spring 54.

Crystal growth is achieved after sphere 40 is completely melted. To grow a crystal, power to wire 58 is adjusted to slowly lower the temperature of molten sphere 40 and encapsulant 80 while power to wire 66 is further reduced. This allows heat from sphere 40 to be transferred via seed crystal 76 and heat transfer rod 70 to heat dissipating member 72. Alternately, the conductance of heat into heat dissipating member 34 may be adjusted by means not shown to regulate heat flow into heat dissipating member 72.

As seed crystal 76 is further cooled, adjacent molten material around it is also cooled to below its melting point, causing the molten material around crystal 76 to freeze. As more heat is removed, the crystal grows, propagating outward from seed crystal 76. Power to wire 58 is adjusted to provide some heat to the periphery of molten sphere 40, causing the growing crystal to present a convex interface with the molten portion of the remaining crystalline material. Additionally, in order to achieve a fairly constant crystal growth rate, additional heat may be provided by wire 58 during the time the crystal is growing.

Encapsulant 80 performs several functions which are desirable in preventing defects in the growing crystal. Initially, it prevents molten sphere 40 from contacting interior wall 86, preventing contamination of sphere 40. Additionally, encapsulant 80 provides a deformable medium for a growing crystal, which eliminates mechanical strains in the growing crystal. Further, encapsulant 80 provides a sealing effect, preventing the escape of volatile components or the formation of free surfaces of molten sphere 40 which could respond to vibrations. Still further, because encapsulant 80 is chosen to be viscous in the molten state, surface tension driven flows are strongly damped because of the no-slip boundary condition between interior wall 86 and encapsulant 80. These flows are still further reduced because of the heat leveling effect provided by the high thermal conductivity of refractory wall 56, which is essence provides a constant and even temperature to the outer periphery of molten sphere 40.

Figure 4:
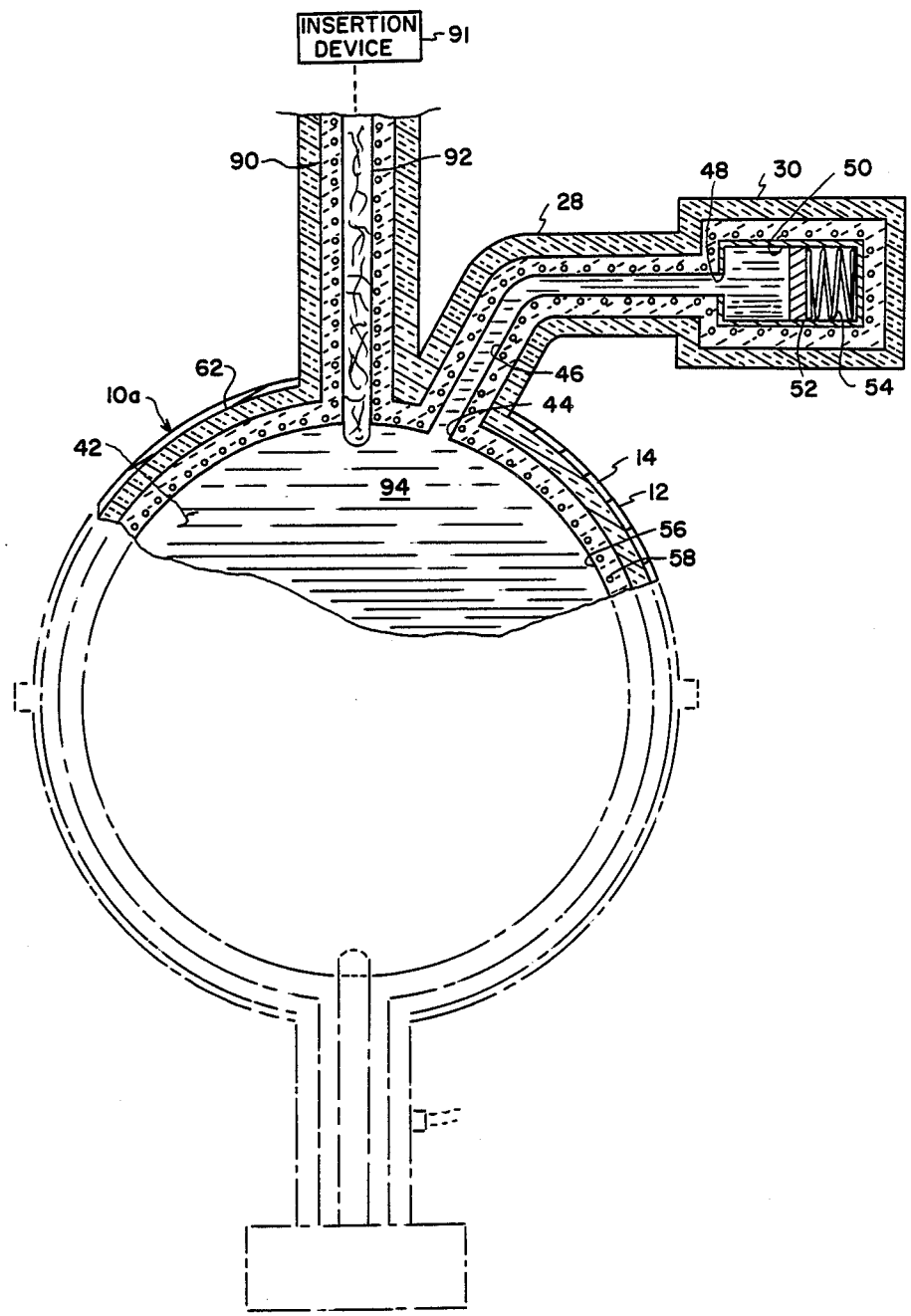
FIG. 4 is a partial elevational view, solid lines being cut away for clarity, of an alternate embodiment of the invention.

Alternately, and as shown in FIG. 4, crystals may be grown in an apparatus 10a, with like components carrying the same designation reference numerals as in FIGS. 1–3. Apparatus 10a has a tube 90 through which additional crystalline material 92 may be added. Tube 90 is similarly constructed as tubular member 28, with refractory wall 62 and wire 58 extending into it, preventing unwanting cooling. In this embodiment, organic or inorganic crystals are grown from a heated solution 94 containing a solvent which is supersaturated with a solute crystalline material from which a crystal is to be grown. A seed crystal is attached to the transfer rod as described, and the temperature of interior 42, and thus solution 94, is slowly lowered as described. This increases the equilibrium concentration of the solute in the solution which results in crystalline material being deposited on the seed crystal. As the temperature of container 12 is further lowered and regulated as described, this additionally deposited material develops into a generally spherical crystal. As the solution 94 surrounding the growing crystal is gradually depleted of crystalline solute, additional solid crystalline material 92 is fed into container 12 via tube 90 and insertion device 91, with the solid material being dissolved by the depleted solvent. In this case, the dissolved crystalline material resolidifies around the growing crystal with lowered temprature. Additionally, when crystal growth from a solution is desired, the need for an encapsulant may be eliminated because the solvent solution 94 acts as the encapsulating material.

The primary advantage of growing crystals from a solution is that lower growth temperatures may be used, which conserves power and reduces point defects. One example of an inorganic crystal grown from solution is mercury cadmium telluride (HgCdTe), which utilizes an excess of tellurium (Te) as the solvent. The crystal is grown at a temperature between 500° C. and 600° C., depending on the concentrations of mercury (Hg) and cadmium (Cd) in the tellurium (Te). A crystal of mercury cadmium telluride (HgCdTe) grown as described earlier in the encapsulated process would require a temperature over 800° C. to melt a polycrystalline sphere of these materials. One example of an organic crystalline system is one where dichloromethane, acetone, methylacetate or any other polar organic solvent is super saturated with a polyacetylene such as TCDU ($C_4[(CH_2)_4OCONHC_6H_5]_2$). In this system, the super saturated solution is heated to no more than 300° C. and cooled to room temperature to grown a crystal of TCDU.

Figure 5:
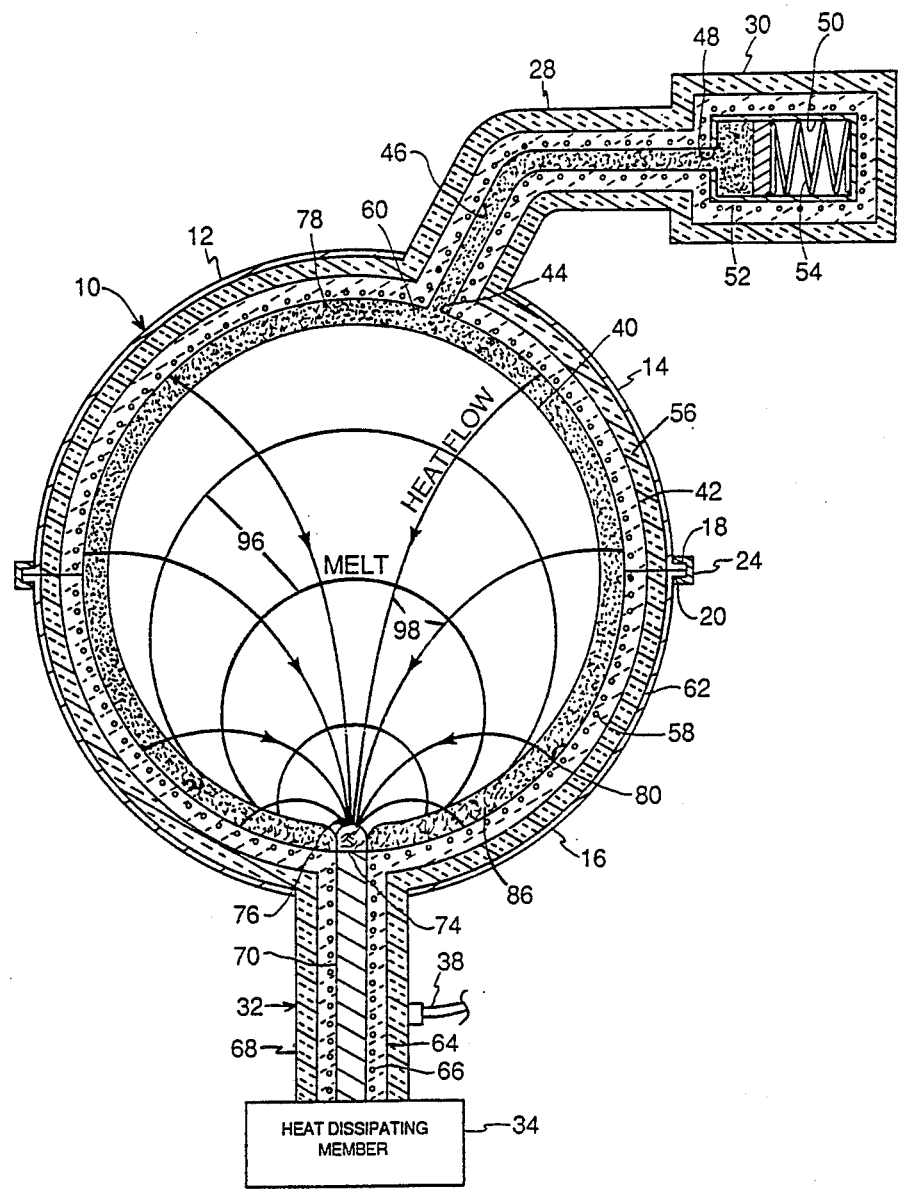
FIG. 5 depicts the freezing isotherm and heat flow paths that occur during crystal growth.

FIG. 5 depicts the freezing isotherm 96 and heat flow paths 98 that occur during crystal growth. By slowly lowering the temperature of the spherical furnace and adjusting the rate of heat flow through the controlled heat leak, the freezing isotherm 96 maintains essentially a spherical shape as it progresses through the melt. This results in a more or less spherical shape that is tangent to the furance wall in the vicinity of the seed crystal. The spherical shape minimizes the trapping of defects since the growing crystal always presents a convex interface to the melt. Growth rate of the crystal in this method will be a function of position and cannot be uniform over the entire crystal as a consequence of the thermal configuration. The maximum growth rate will occur along the axis of symmetry and will tend to increase with time if the furnace temperature were lowered at a uniform rate. However, by programming the furnace temperature, the maximum growth rate can be kept constant.

The above-described techniques for growing crystals may be advantageously effected by growing the crystals in a microgravity environment. As the densities between the encapsulating material and the crystalline material are most likely to be different, buoyancy forces in a gravity environment tend to deform the growing crystal, causing it to touch the interior wall of the container. In microgravity, this problem is eliminated since buoyancy is a gravity-driven property. Additionally, convective flows resulting from buoyancy are reduced or eliminated in a microgravity environment.

From the foregoing, it is apparent that the applicants have provided an improved apparatus for growing large crystals of a strategic and commercial value. This is done by growing the crystal in a deformable environment, allowing it to expand or contract without contacting rigid container walls. Furher, by surrounding the growing crystal by a viscous encapsulating material, convective flows are strongly damped. Still further, the thermal profile and spherical configuration of the growth container easily permit the formation of a convex growth interface, which is desired in growing defect-free crystals.

What is claimed is:

1. An apparatus for processing crystalline material comprising:
   an enclosure having a spherical interior, said enclosure having spaced first and second openings;
   a first tubular member having first and second ends, said first end coupled to said enclosure, with said hollow region communicating with said first opening;
   pressurizing means connected to said second end of said first tubular member for applying pressure to said interior;
   a second tubular member having first and second ends, said first end coupled to said second opening;
   a rod of heat conductive material having first and second ends, said rod centrally positioned within and extending the length of said second tubular member;
   a seed crystal positioned within said interior, said seed crystal coupled to said first end of said rod;
   a heat dissipating member coupled to said second end of said rod;
   first adjustable heating means for providing an adjustable level of heat to said rod; and
   second adjustable heating means for providing an adjustable, even level of heat to said interior;
   whereby crystalline material positioned within said interior is heated to a predetermined temperature, after which application of heat is reduced, allowing heat to be transferred from said crystalline material via said seed crystal and said heat conductive rod to said heat dissipating member, thereby gradually lowering the temperature of said crystalline material and causing it to solidify as a single crystal on said seed crystal and propagate outward from said seed crystal in a spherical configuration.

2. An apparatus as set forth in claim 1 comprising separation means for separating said enclosure into two halves, thereby providing access to said interior.

3. An apparatus as set forth in claim 2 wherein said pressurizing means comprises:
   a cylinder having an opening at one end connected to said second end of said first tubular member and said cylinder closed at an opposite end;
   a piston positioned within said cylinder near said opening; and
   a spring positioned between said piston and said closed end of said cylinder.

4. An apparatus as set forth in claim 3 including a cover material on said spherical interior providing an encapsulating cover for a solid sphere of crystalline material within said interior.

5. An apparatus as set forth in claim 4 wherein said encapsulating cover material is chemically and electrically inert with respect to said sphere.

6. An apparatus as set forth in claim 5 wherein said encapsulating cover material and said sphere are immiscible when both are in a liquid state.

7. An apparatus as set forth in claim 3 comprising an enclosure having a third opening, and crystalline material insertion means coupled to said third opening for inserting crystalline material through said third opening to said interior.

* * * * *